Oct. 29, 1963 V. RODEK 3,109,153
ADJUSTABLE PIEZOELECTRIC WAVE FILTER HAVING TWO RESONANCE PEAKS
Filed Nov. 18, 1960
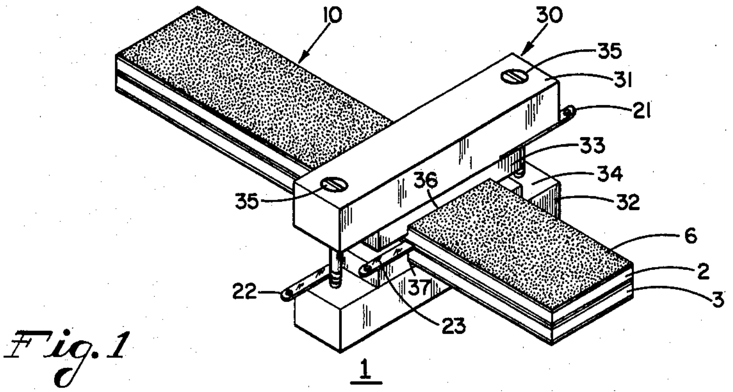
Fig. 1
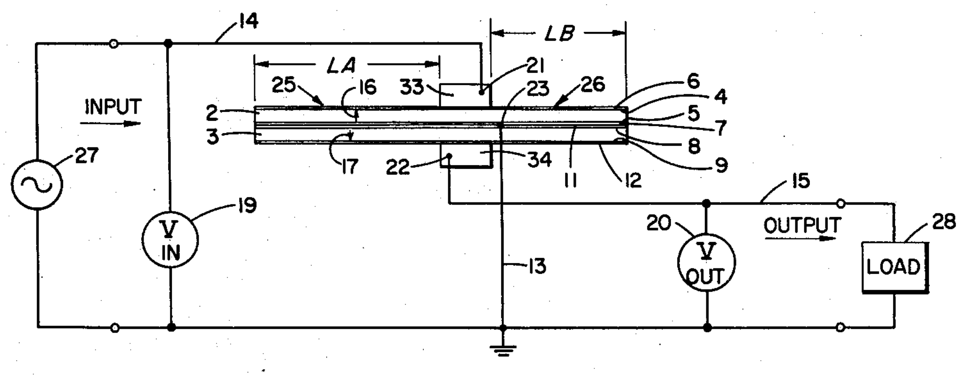
Fig. 2
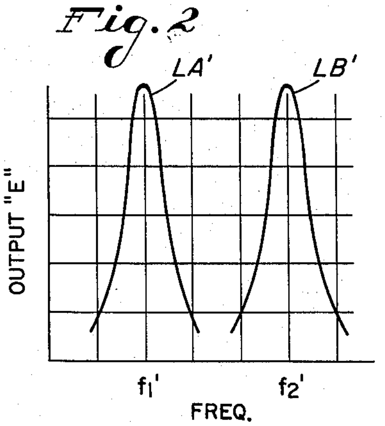
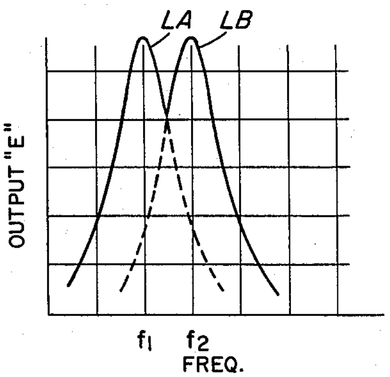
Fig. 3 Fig. 4
INVENTOR.
VICTOR RODEK
BY George J. Seligsohn
ATTORNEY United States Patent Office 3,109,153
Patented Oct. 29, 1963

3,109,153
ADJUSTABLE PIEZOELECTRIC WAVE FILTER HAVING TWO RESONANCE PEAKS

Victor Rodek, Rochester, N.Y., assignor to General Dynamics Corporation, Rochester, N.Y., a corporation of Delaware Filed Nov. 18, 1960, Ser. No. 70,274
10 Claims. (Cl. 333—72)

This invention relates to electric wave filters and more particularly to piezoelectric wave filters.

Although the invention herein disclosed has many applications, it is particularly adapted as a bandpass filter in a frequency selective telephone tone ringer circuit of a party line telephone system. For this application it is very essential that the filter pass only those frequencies selected which are within a relatively narrow band on either side of the center frequency. The operating frequencies are generally in the audio range.

Prior art piezoelectric bandpass filters operative in the audio frequency range may comprise a plurality of resonator elements consisting of a flat plate of material, an input resonator consisting of a flat plate of material mechanically coupled to one edge of the resonator element and an output resonator, consisting of a flat plate of material mechanically coupled to the opposite edge of the resonator element. Included further there may be a first piezoelectric element coupled to the input resonator for exciting a bending mode of vibration therein about modes that are transverse to a plane surface formed by the length and thickness of the input resonator.

Also included is a second piezoelectric element coupled to the output resonator for detecting a bending mode of vibration therein about the modes.

The above-mentioned bandpass filters have the disadvantage that many resonator elements are involved to produce the desired bandpass characteristic which not only reduces the reliability, but increases the cost of the filter proportional to the plurality of elements therein. Further, the bandpass characteristics may not be easily varied.

Other prior art piezoelectrical bandpass filters have utilized the newer polarizable ferroelectric ceramic materials which are capable of accepting and retaining a permanent remanent electrostatic polarization which imparts piezoelectric properties to the material. For the most part, these bandpass filters comprise discoid bodies having axial and radial modes of vibration.

Such bandpass filters may comprise a plurality of cooperating polarized ceramic discs, means for mounting the discs adjacent each other in axial alignment with each other and having their opposed faces in close engagement. Included further, is a highly conductive metallic coating on each of the opposite faces of the discs. The mounting means may consist of a non-conductive U-shaped clamp having screw adjusting means in each arm of the clamp for varying the tightness of engagement of the opposed faces for varying the pass band width of the filter and electrical input and output connectors for the disc.

Although the pass band width of the filter may be easily changed by the coaction of the adjusting screws, the filter has a disadvantage in that adjustment is sensitive not only in the original setting but also to ambient heat which affects expansion in the U-shaped clamp.

Other prior art ceramic discoid shape filters may include a ceramic disc having a concentric circular groove on diametrically opposite principal faces of the discoid shape filter to vary the coupling between the axial and radial modes of vibration of the filter. The groove is usually located at a point of minimum vibrational stress for mechanical strength consideration. The resultant thinning of the principal surface has the disadvantage that the filter is subject to stress fatigue and breakage proximal to the groove.

Accordingly, it is the general object of the invention to provide an improved and structurally compact filter that operates in the audio frequency range.

It is another object of the present invention to provide a piezoelectric bandpass filter which may be easily adjusted for a plurality of bandwidths.

It is another object of the invention to provide a novel piezoelectric bandpass filter having an input and an output in the form of an electric signal.

It is yet another object of the invention ot provide a bandpass filter having two tuned frequencies which may be varied by simple adjustment.

A still further object of this invention is to provide a piezoelectric bandpass filter which may be produced more economically than other bandpass filters.

A still further object of the invention is to reduce the number of mechanical vibrating elements in a filter.

A still further important object of this invention is to provide a piezoelectric device having substantially flat steep skirted bandpass characteristics adapted as an improved means for electrically coupling an input circuit to an output circuit.

The present invention accomplishes the above-cited objects by providing a piezoelectric wave filter comprising a piezoelectric unit including first and second relatively thin long longitudinal members of piezoelectric material and means for clamping the unit along a line which is transverse to the longitudinal axis of the first and second members whereby the line divides the unit in a first portion on one side and a second portion on the other side of the line. The first portion has a resonant mode of vibration at a first given predetermined frequency and the second portion has a second resonant mode of vibration at a second given predetermined frequency. Included further are input electrode means coupled to the first member for applying alternating signals, thereto tending to induce vibration therein. Also included are output electrode means coupled to the second member for conducting output potentials derived in response to vibration thereof.

The principle of operation of the piezoelectric wave filter may be characterized by piezoelectric conversion of electric energy into mechanical energy, the direct piezoelectric effect, and a reconversion of the mechanical energy back into electrical energy, the inverse piezoelectric effects.

In accordance with the present invention, the first and second resonant mode of vibration of the first and second portion may be varied easily by re-locating the means for clamping the unit at a different position along the longitudinal axis of the first and second longitudinal members, and transverse to the longitudinal axis of the first and second member.

Thus, the piezoelectric wave filter may have two individual sharply tuned bandpass characteristics which may be made to overlap to give a single bandpass characteristic having a wider bandpass.

Further objects and advantages of the invention will become apparent as the following description proceeds and the feature of novelty which characterizes the invention will be pointed out in particularly in the claims annexed to and forming a part of this specification.

For a better understanding of the invention, reference may be had to the accompanying drawing which consists of four figures on a single sheet.

FIGURE 1 illustrates a preferred embodiment of the invention in a prespective view;

FIGURE 2 is a schematic test circuit, including the preferred embodiment of the invention shown in FIGURE 1;

FIGURE 3 is a graph showing a plot of the output voltage characteristic against frequency for one adjustment of the filter shown in FIGURES 1 and 2; and FIGURE 4 is a graph showing a plot of the output voltage characteristic against frequency for a different adjustment of the filter shown in FIGURES 1 and 2.

Referring now to FIGURES 1 and 2 and, more particularly to FIGURE 1, there is shown one preferred embodiment of the piezoelectric wave filter 1 which is made in accordance with the invention. The piezoelectric wave filter 1 comprises a piezoelectric unit 10, a clamp assembly 30 and first, second and third terminals 21, 22, and 23 respectively.

The piezoelectric unit 10 comprises first and second relatively thin longitudinal members 2 and 3 respectively made from polarizable ferro-electric ceramic material which may be barium titanate and solid solutions of lead zirconate and lead titanate. When polarized by the application of a strong electrostatic field, these ceramic members 2 and 3 have properties corresponding to the piezoelectric effect of crystalline materials, such as quartz and Rochelle salt. U.S. Patent No. 2,486,560 to Gray and U.S. Patent No. 2,708,244 to Bernard Jaffe disclose manners of fabricating and polarizing ferroelectric ceramics.

The first member 2 includes first and second diametrically opposite principal surfaces 4 and 5 respectively. The first and second principal surfaces 4 and 5 are coated with electrically conducting material to form first and second electrodes 6 and 7 respectively. The first member 2 is polarized transversely to the longitudinal axis of the blade 2 and normal to the principal surfaces 4 and 5 as shown by arrow 16 in FIGURE 2.

The second member 3 includes third and fourth principal surfaces 8 and 9 respectively. The third and fourth surfaces 8 and 9 are coated with electrically conducting material to form third and fourth electrodes 11 and 12 respectively. The second member 3 is polarized transversely to the longitudinal axis of the blade 3 and normal to the principal surfaces 4 and 5, as shown by arrow 17 in FIGURE 2.

The first and second members 2 and 3 are fastened together by a suitable cement such as one of the epoxy resins along one of their principal surfaces namely, surfaces 7 and 8 as shown in FIGURE 2.

The first and second blades 2 and 3 are oriented in cooperative relationship with each other so that a voltage applied to electrodes 6 and 7 tends to change the length of the first member 2. However, the change of length of member 2 is restrained by member 3 which is firmly bonded to member 2 so that the net result is a bending action of members 2 and 3, motion occurring at right angles to the forced change in length. Due to flexure in member 3, a voltage is developed between electrodes 11 and 12 by direct piezoelectric action of member 3. Similarly, voltage applied to electrodes 11 and 12 results in a bending action of members 2 and 3 which causes a voltage to develop between electrodes 6 and 7 by the direct piezoelectric action of member 2.

The structure of the piezoelectric unit 10 including the electrodes 6, 7, 11 and 12 and the orientation as well as the polarization 2 and 3 are well known to those skilled in the art and form no part of this invention.

The clamp assembly 30 comprises upper and lower insulating blocks 31 and 32 respectively, first and second contact clamping members 33 and 34 respectively and screws 35.

The first and second contact clamping members 33 and 34, shown in FIGURE 2, are rectangular in cross section. The first and second clamping members 33 and 34 include channels 36 and 37 respectively, each having a channel width substantially equal to the width of the piezoelectric unit 10. The depth of channels 36 and 37 is less than the individual thickness of the first and second members 2 and 3 respectively.

Shown at 23 is a common terminal connected to electrodes 7 and 8. Terminal 22 is connected to contact clamping members 34 and terminal 21 is connected to contact clamping member 33. The terminals 21, 22 and 23 are applied to members 33, 34 and electrodes 7 and 8 respectively in any desired fashion, since neither the terminal nor the mode of connection forms any part of this invention. The terminals 21, 22 and 23 are positioned within the clamped area of the first and second members 2 and 3 so as not to participate in the modal vibration of the piezoelectric unit 10.

The insulating blocks 31 and 32 include two sets of axially aligned holes 38 and 39 for screws 35. The contact clamping members 33 and 34 may be molded as inserts in the insulating blocks 31 and 32 respectively to give a unitary structure. This, of course, will be helpful for aligning the piezoelectric unit 10 with respect to clamp assembly 30.

In accordance with the invention, the piezoelectric unit 10 is disposed in channels 36 and 37 between the axially aligned contact clamping members 33 and 34. The clamping members 33 and 34 are transverse to the longitudinal axis of the piezoelectric unit 10, and clamp only a small portion of the piezoelectric unit 10 along a line transverse to the longitudinal axis of members 2 and 3. Disposed on one side of the clamping members 33 and 34 is a first unclamped portion forming a first composite cantilever portion 25 having a given first length $L_A$. Disposed on the other side of the clamping members 33 and 34 is a second unclamped portion forming a second composite cantilever portion 26 having a second given length $L_B$.

The first and second composite cantilever length $L_A$ and $L_B$ respectively are not equal to each other. The filter characteristics are a function of the length $L_A$ and $L_B$ of the first and second composite cantilever portions 25 and 26 respectively.

The longitudinal or essential mode of vibration of the first and second composite cantilever portions 25 and 26 has a natural resonant frequency which is a function of their respective length $L_A$ and $L_B$ and their thickness (T).

The first composite cantilever portion 25 has a resonant frequency $F_1$ equal to a constant (K) times the thickness (T) of the piezoelectric unit 10 all divided by the square of the first length ($L_A$).

The second composite cantilever portion 26 has a resonant frequency $F_2$ equal to a constant (K) times the thickness (T) of the piezoelectric unit 10 all divided by the square of the second length ($L_B$).

Thus, the piezoelectric filter 1 may have at least two natural resonant frequencies $F_1$ and $F_2$ which may be easily changed to various values by moving the piezoelectric unit 10 relative to the clamp assembly 30. This of course, is done by simply unclamping and sliding the piezoelectric unit 10 along channels 36 and 37. If a single resonant frequency is desired, lengths $L_A$ and $L_B$ are made equal to each other.

FIGURE 2 illustrates schematically a test circuit embodying the wave filter 1 shown in FIGURE 1. In the test circuit, a signal generator is shown at 27 and a load having a given impedance is shown at 28. An input voltmeter 19 is connected across the signal generator 27 to measure the input voltage. The filter 1 is provided with electrical connections as already described. The inner electrodes 7 and 11 are connected to a ground point by lead wire 13 and terminal 23. Both the load 28 and signal generator 27 are grounded on one side. The clamping members 33 and 34 not only coarctate the piezoelectric unit 10 but also provide an electrical connection to electrodes 6 and 12 respectively. Lead wire 14 connects to terminal 21 on the filter 1 and to the other side of the signal generator 27.

The output signal from the piezoelectric unit 10 appearing across the impedance load 28 is measured by voltmeter 20. An output circuit includes piezoelectric member 3 and its associated electrodes 11 and 12, terminal 22 and 23, lead wires 13 and 15, and load 28.

Typical of the frequency response characteristics of the filter 1 according to the present invention is the plot of the output voltage verses frequency shown in FIGURES 3 and 4. FIGURE 4 shows the effect when the lengths $L_A$ and $L_B$ differ only slightly. The frequency response characteristics of the first and second portions overlap to give broad bandpass characteristics. The voltage peak of each curve is equal in consequence of the electrical connection of the filter 1 since electrodes 11 and 12 are common to the first and second portions 25 and 26.

FIGURE 3 shows the effect when the lengths $L_A'$ and $L_B'$ differ substantially. The frequency response characteristics of the first and second portions 25 and 26 respectively, are spaced apart from each other so as to constitute two narrow bandpass curves.

The operation of the piezoelectric filter 10 will be described in conjunction with FIGURES 1 and 3, wherein the lengths $L_A'$ and $L_B'$ differ substantially. The operation of the piezoelectric filter may be considered under the influence of applied potential, having a first frequency equal to the resonant frequency $F_1'$ of vibration of the first portion 25 and a second frequency equal to the resonant frequency $F_2'$ of vibration of the second portion 26. The signal generator 27 applies a potential between electrodes 6 and 7 which creates an electric field gradient between electrodes 6 and 7. A property of piezoelectric material in member 2 is that upon application of an electric field to the material in a direction parallel to the direction of polarization of the piezoelectric material, a strain or physical deformation will occur parallel to the direction of the field. The strain takes the form of an extension or contraction depending upon the relative orientation of the electric field with respect to the direction of polarization. When the electrical field across electrodes 6 and 7 alternates in direction, the piezoelectric member 2 will alternately expand and contract. Stresses periodically occurring within member 2 will produce strains in member 3 which is coupled to member 2. If the applied potential has a frequency equal to the resonant frequency $F_1'$, of the first portion 25, the composite cantilever portion 25 will be excited to resonate as a single body with greatly intensified stresses and strain. Further, if the applied potential across electrodes 6 and 7 has a frequency equal to the resonant frequency $F_2'$ of the second portion 26, the composite cantilever portion 26 will also be excited to resonate as a single body.

In response to the resonant frequency $F_1'$ and $F_2'$ of the first and second portions 25 and 26, respectively, effective conversion of energy occurs. The reverse property of a piezoelectric material is that upon application of a stress thereto in a direction parallel to the direction of polarization of the piezoelectric material, a potential will appear in a direction parallel to the direction of application of the stress. The material in member 3 is alternately stressed in a direction affecting alternate compression and extension, the potential appearing will be an alternating potential having a frequency $F_1'$ and $F_2'$ corresponding to the first and second portions 25 and 26. Electrodes 11 and 12 will conduct the average potential of the first and second portion 25 and 26 across a load 28. The average potential will have a frequency dependent upon the vibration of the first and second portion 25 and 26 respectively.

FIGURE 3 graphically illustrates a plot of the frequency for the potential appearing across electrodes 11 and 12 when a potential is applied to electrodes 6 and 7 as just described above.

When the filter 1 is adjusted in accordance with the invention, lengths $L_A$ and $L_B$ may differ only slightly so that a plot of the voltage versus the frequency for the first and second portions 25 and 26 will give two overlapping curves as shown in FIGURE 4. The two curves overlap to give wide bandpass characteristics.

The filter 1 in accordance with the invention may be adjusted to give narrow bandpass characteristics, wide bandpass characteristics or two narrow bandpass characteristics having a resonant frequency $F_1$ and $F_2$. As was mentioned before, this is simply accomplished by varying lengths $L_A$ and $L_B$ of the first and second portion 25 and 26 respectively.

Although the invention is ideally suited as a bandpass filter, it is also suited as a transformer or transducer. It should be also understood that the piezoelectric member 3 may be connected to an input circuit and that member 2 may be connected to an output circuit, since the first and second members 2 and 3 are symmetrical. Further, it should be understood that the first and second member 2 and 3 may be made from piezoelectric crystals such as quartz.

While there has been described what is at present considered to be a preferred embodiment of the invention, it will be obvious to those skilled in the art the various changes and modifications which may be made therein without departing from the invention, and it is aimed in the appended claims to cover all such changes and modifications as fall within the true spirit and scope of the invention.

What is claimed is:

1. In combination, a piezoelectric unit including first and second relatively thin longitudinal members of piezoelectric material having a given length, means movable along the longitudinal axis of said first and second members for selectively and rigidly clamping said unit along a line which is transverse to the longitudinal axis of said first and second members whereby said line divides said unit into a first portion on one side and a second portion on the other side of said line, said first portion having a first resonant mode of vibration at a first given frequency determined by the length of said first portion, said second portion having a second resonant mode of vibration at a second given frequency determined by the length of said second portions, input electrode means coupled to said first member for applying alternating signals thereto tending to induce vibrations therein, and output electrode means coupled to said second member for conducting output potentials derived in response to vibrations thereof.

2. In the combination according to claim 1, wherein said means for clamping said unit includes first and second axially aligned parallel bars.

3. In the combination according to claim 2, wherein said first and second axially aligned parallel bars are electrically conducting.

4. In the combination according to claim 1, wherein said first member includes two diametrically opposite principal surfaces and said input electrode means includes electrically conducting material coated on said diametrically principal surfaces of said first member.

5. In the combination according to claim 1, wherein said second member includes two diametrically opposite principal surfaces and said output electrode means includes electrically conducting material coated on said diametrically principal surfaces of said second longitudinal member.

6. The combination defined in claim 1 wherein said first and second opposed longitudinal members each has two principal faces thereon, said input electrode means includes a flexible electrical conducting coating on said principal faces of said first member and said output electrode means includes a flexible electrical conducting coating on said principal faces of said second member.

7. The combination defined in claim 6 wherein said first member in said unit is bonded to said second member along one of said principal faces.

8. In combination, a piezoelectric unit including first and second relatively thin longitudinal opposed members of piezoelectric material having a given length, means movable along the longitudinal axis of said first and second members for selectively and rigidly clamping said unit along a line which is transverse to the longitudinal axis of said first and second members whereby said line divides said unit into a first portion on one side and a second portion on the other side of said line, said first portion having a first resonant mode of vibration at a first given frequency determined by the length of said first portion, said second portion having a second resonant mode of vibration at a second given frequency determined by the length of said second portion, input electrode means associated with said first member adapted to excite resonant vibrations in said first and second portions of said unit when energized by potentials of said first given frequency and said second given frequency, respectively, and output electrode means associated with said second member adapted to derive output potentials in response to said resonant vibrations of said first and second portions.

9. In a band-pass filter, a piezoelectric unit including first and second relatively thin longitudinal members of piezoelectric material, each of said first and second members having two principal faces which are diametrically opposed to each other, means movable along the longitudinal axis of said first and second members for selectively and rigidly clamping said unit along the line which is transverse to the longitudinal axis of said first and second members whereby said line divides said unit into a first portion on one side and a second portion on the other side of said line, said first portion having a first resonant mode of vibration at a first given frequency determined by the length of said first portion, said second portion having a second resonant mode of vibration at a second given frequency determined by the length of said second portion, input electrode means including a flexible electrical conducting coating on said principal faces of said first member for simultaneously exciting resonant vibrations in said first and second portions of said unit when energized by signal potentials having frequency components of said first and said second given frequencies, respectively, and output electrode means including a flexible electrical coating on said principal faces of said second member for deriving output potentials from said resonant vibrations of said first and second portions.

10. A band-pass filter responsive to an input signal having a plurality of component frequencies for passing only predetermined ones of said component frequencies, said band-pass filter comprising a piezoelectric unit including first and second coacting relatively thin longitudinal opposed members of piezoelectric material having a given length, means movable along the longitudinal axis of said first and second members for selectively and rigidly clamping said unit along a line which is transverse to the longitudinal axis of said first and second members whereby said line divides said unit into a first portion on one side and a second portion on the other side of said line, input electrode means coupled across said first member for vibrating said first portion in a transverse mode at a first frequency corresponding to one of said predetermined component frequencies and simultaneously vibrating said second portion at a second frequency corresponding to another of said predetermined frequencies, said first frequency being determined by the length of said first portion, said second frequency being determined by the length of said second portion, and output electrode means coupled to said second member for receiving an output signal generated by the vibration of said second member.

References Cited in the file of this patent

UNITED STATES PATENTS

| | | |
|---|---|---|
| 1,829,234 | McNicolson | Oct. 27, 1931 |
| 2,045,999 | Mason | June 30, 1936 |
| 2,155,035 | Breling | Apr. 18, 1939 |
| 2,166,763 | Mason | July 18, 1939 |
| 2,227,268 | Mason | Dec. 31, 1940 |
| 2,240,293 | Goddard | Apr. 29, 1941 |
| 2,835,761 | Crownover | May 20, 1958 |